United States Patent [19]

Kamuro et al.

[11] Patent Number: 4,988,901
[45] Date of Patent: Jan. 29, 1991

[54] PULSE DETECTING DEVICE FOR DETECTING AND OUTPUTTING A PULSE SIGNAL RELATED TO THE SLOWER FREQUENCY INPUT PULSE

[75] Inventors: Setsufumi Kamuro; Yoshiaki Shibuya, both of Matsudo; Hiroyuki Ozu, Ikoma, all of Japan

[73] Assignee: Sharp Kabushiki Kaisha, Osaka, Japan

[21] Appl. No.: 338,278

[22] Filed: Apr. 14, 1989

[30] Foreign Application Priority Data

Apr. 15, 1988 [JP] Japan .................................. 63-93844
Mar. 29, 1989 [JP] Japan .................................. 1-77533

[51] Int. Cl.⁵ .......................... H03K 9/06; H03L 7/00
[52] U.S. Cl. .................................. 307/518; 307/525; 307/271; 328/109; 328/137; 328/104; 328/154; 328/140
[58] Field of Search ............... 328/133, 134, 137, 140, 328/109–111, 104, 153; 307/529, 522–524, 234, 525, 528, 518; 331/44, 49

[56] References Cited

U.S. PATENT DOCUMENTS

| 3,594,656 | 7/1971 | Tsukamoto | 331/49 |
| 3,708,686 | 1/1973 | Butler, Jr. et al. | 307/525 |
| 4,777,477 | 10/1988 | Mueller | 328/140 |
| 4,816,776 | 3/1989 | Kessler | 331/44 |
| 4,853,653 | 8/1989 | Maher | 331/49 |

Primary Examiner—Timothy P. Callahan

[57] ABSTRACT

In a pulse detecting device, there is provided a condition detecting circuit, or a pulse detecting circuit, which receives separate pulse signals and detects the condition of the receioved signals. A condition change detecting circuit, or pulse change detecting circuits, detects the change of the condition of the received signals, whereby a pulse synthesizing circuit synthesizes the pulse signals obtained in said condition change detecting circuit and generates a pulse signal corresponding to any one of the input pulse signals having the slower pulse frequency.

13 Claims, 7 Drawing Sheets

PULSE DETECTING DEVICE FOR DETECTING AND OUTPUTTING A PULSE SIGNAL RELATED TO THE SLOWER FREQUENCY INPUT PULSE

BACKGROUND OF THE INVENTION

1. Field of the Invention

The present invention relates to a pulse detecting device for detecting pulses having any frequencies, and more particularly, to a device for generating a pulse signal based on the slower pulses of input pulse signals.

2. Description of the Background Art

In order to detect one or more pulses, conventional mechanical pulse detection devices employing switches have been used. In the conventional device, since there must be provided mechanical processing, the structure is complicated and it has been difficult to decrease the size of the device.

SUMMARY OF THE INVENTION

An essential object of the present invention is to provide a pulse detecting device which can be manufactured with electronic elements of a small size.

Another object of the present invention is to provide a pulse detecting device which can be assembled with semiconductor circuit elements.

According to the present invention, there is provided a pulse detecting device which comprises a pulse detection circuit, or condition detecting circuit, having two input terminals for receiving separate pulse signals and for detecting the condition of the received signals, a pulse change detecting circuit, or condition change detecting circuit, for detecting the change of the condition of the received signals in said condition detecting circuit, and a pulse synthesizing circuit for synthesizing the pulse signals obtained in said condition change detecting circuit and for generating pulse a signal corresponding to any one of the input pulse signals having the slower pulse frequency.

There is further provided a pulse detecting device which comprises:

first means for receiving two input pulse signals and for generating pulse signals at two separate output terminals with different phase, even if the two input pulse signals change with the same phase, second means for generating a pulse signal by detecting a condition of the outputs of the first means, third means for discriminating change of the output of the first means, and frequency dividing means for dividing the frequency of the output of the third means into ½ so that the frequency dividing means generates pulse signals corresponding to any one of the input pulse signals having the slower pulse frequency.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE INVENTION

Figure 1:
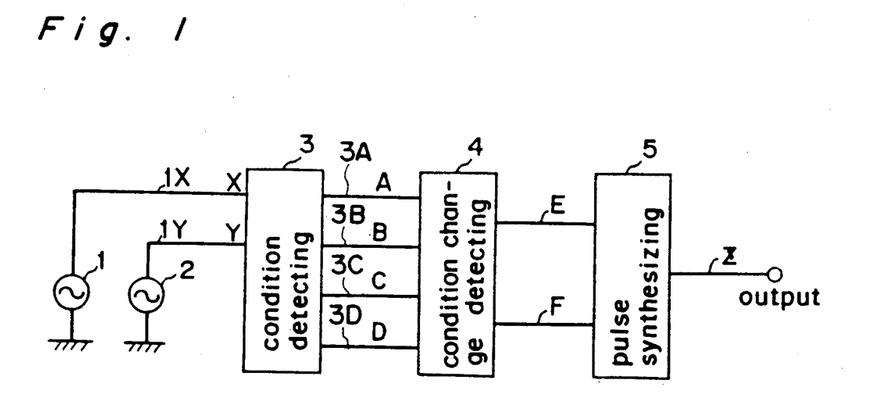
FIG. 1 is a block diagram showing an embodiment of a pulse detecting device according to the present invention.

Referring to FIG. 1, two pulse sources 1 and 2 are connected to a condition detecting circuit 3, or a pulse detecting circuit, which detects two input pulses X and y, applied thereto through terminals 1X and 1Y from the input pulse sources 1 and 2, and generates four output signals A, B, C and D by detecting the conditions of the input pulses X and Y, as defined hereinafter. The four output terminals 3A, 3B, 3C, 3D of the condition detecting circuit 3 are connected to four input terminals of a condition change detecting circuit 4, or a pulse change detecting circuit, which detects the change of the conditions of the signals A, B, C and D and generates two output pulses E and F. The pulses E and F generated at the circuit 4 are synthesized in a pulse synthesizing circuit 5 into an output pulse signal Z having a frequency of the slower pulse of the two pulses X and Y.

In the arrangement shown in FIG. 1, the condition of the input signals applied to the terminal 1X and 1Y are discriminated by the condition detecting circuit 3 and converted into four signals A, B, C and D, which are applied to the condition change detecting circuit 4 and the condition change of the two input pulses X and Y is outputted as the two signals E and F from the condition change detecting circuit 4. The output signals E and F are synthesized in the pulse synthesizing circuit 5 into the output pulse signal Z having a frequency based on the frequency of the slower pulse of the input pulses X and Y.

Figure 2:
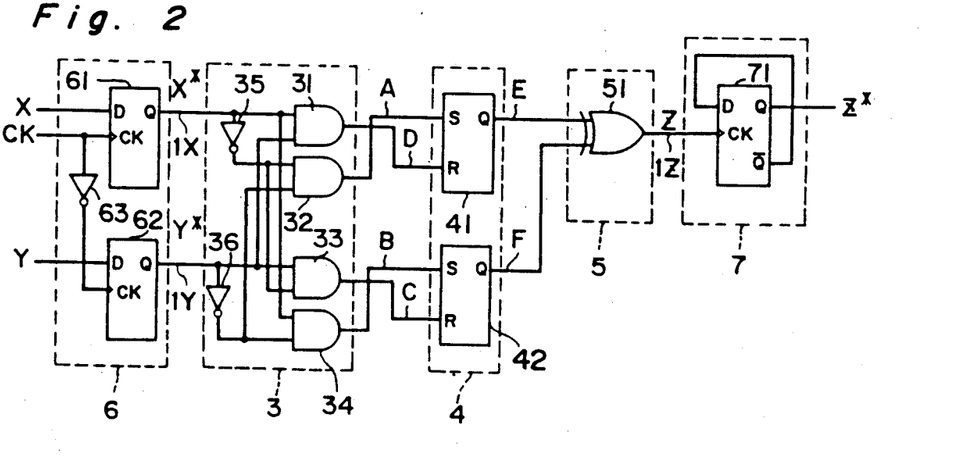
FIG. 2 is a detailed circuit diagram of the pulse detecting device shown in FIG. 1.

The detail of the pulse detecting device is shown in FIG. 2. The condition detecting circuit 3 is formed by four AND gates 31, 32, 33 and 34 and two inverters 35 and 36 connected as shown in the drawings. The condition change detecting circuit 4 is formed by two R-S latch circuits 41 and 42. The pulse synthesizing circuit 5 is formed by an exclusive OR circuit 51. In case there is a possibility of occurrence of two simultaneous pulses at the input terminals 1X and 1Y, there may be added a phase difference generation circuit 6 at the input terminals 1X and 1Y.

Although the output signal Z at the output terminal 1Z may directly be used, there may be provided a frequency divider 7 made of a flip-flop circuit 71 at the output terminal 1Z so as to obtain the output signal having ½ frequency of the output pulse signal Z at the terminal Z*. The ratio of the frequency division may be selected as desired.

In the embodiment shown in FIG. 2, two flip-flops 61 and 62 and an inverter 63 are used as the phase difference generation circuit 6 to which clock pulses sufficiently faster than the two input pulses X and Y are applied to the clock input terminal CK. In this arrangement, it can be spaced a time interval longer than a half of the clock period for the period between change of one pulse X*, for example, to generation of another pulse Y*, whereby it is possible to avoid the simultaneous occurrence of the two pulses X* and Y*.

Figure 3:
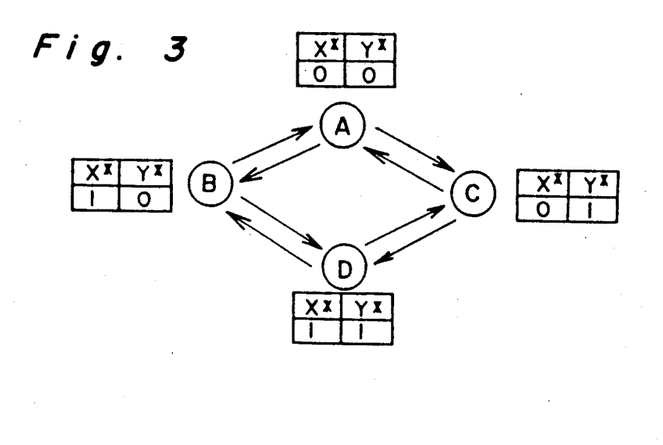
FIG. 3 is a state diagram representing operation of the device shown in FIGS. 1 and 2.

FIG. 3 shows a state diagram for the condition detecting circuit 3. In the device shown in FIGS. 1 and 2, it is assumed that the states A, B, C and D are defined in the table below.

$X^*=0, Y^*=0 : A$
$X^*=1, Y^*=0 : B$
$X^*=0, Y^*=1 : C$
$X^*=1, Y^*=1 : D$

The pulses X and Y applied to the terminals 1X and 1Y are converted to the pulse signals X* and Y* having a predetermined phase difference by the phase difference generation circuit 6. The condition of the pulse signals X* and Y* is discriminated into four states A, B, C and D. Among the various state changes of the pulse signals X* and Y* when the pulses are applied to the terminals X and Y, there are detected the following state changes of A - B - D, A - C - D, D - B - A, D - C - A, B - A - C, B - D - C, C - A - B and C - D - B. The result of the discrimination is output as the signals E or F. It is noted that since the signals X* and Y* are so modified that they do not occur simultaneously, the condition changes A - D, D - A, B - C and C - B do not occur.

Figure 4:
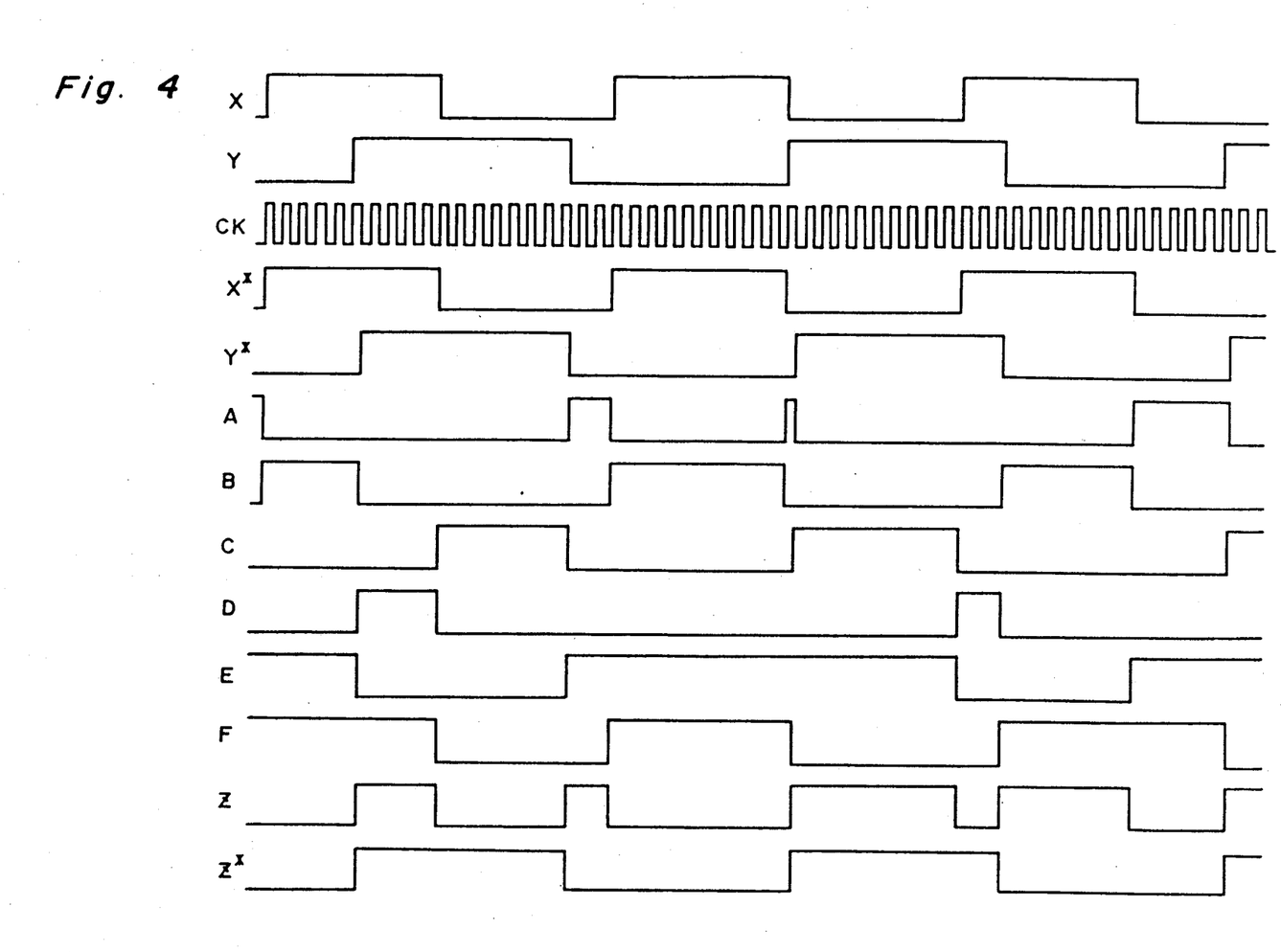
FIG. 4 is a timing diagram showing an operation of the device in FIGS. 1 and 2.

The pulse signals E and F are synthesized by the circuit 5 and the synthesized signal is frequency divided by the divider 7 so that there can be obtained the signals Z*, the frequency of which is divided into ½ from the frequency of the signals Z. FIG. 4 shows an operation of the embodiment shown in FIG. 2.

According to the embodiment shown in FIG. 2, it is possible to output the signal Z* based on the input pulse of the slower frequency of both pulses X and Y.

In the pulse detecting device explained above, if the state changes in the order of A - B - D - C - D - B, the wave form of the output signal Z* must be analogous to the wave form of the input signal Y which contains low frequency components rather than the wave form of the signal X. However, the wave shape of the output signal of the device shown in FIG. 2 is not analogous to the signal Y.

Figure 5:
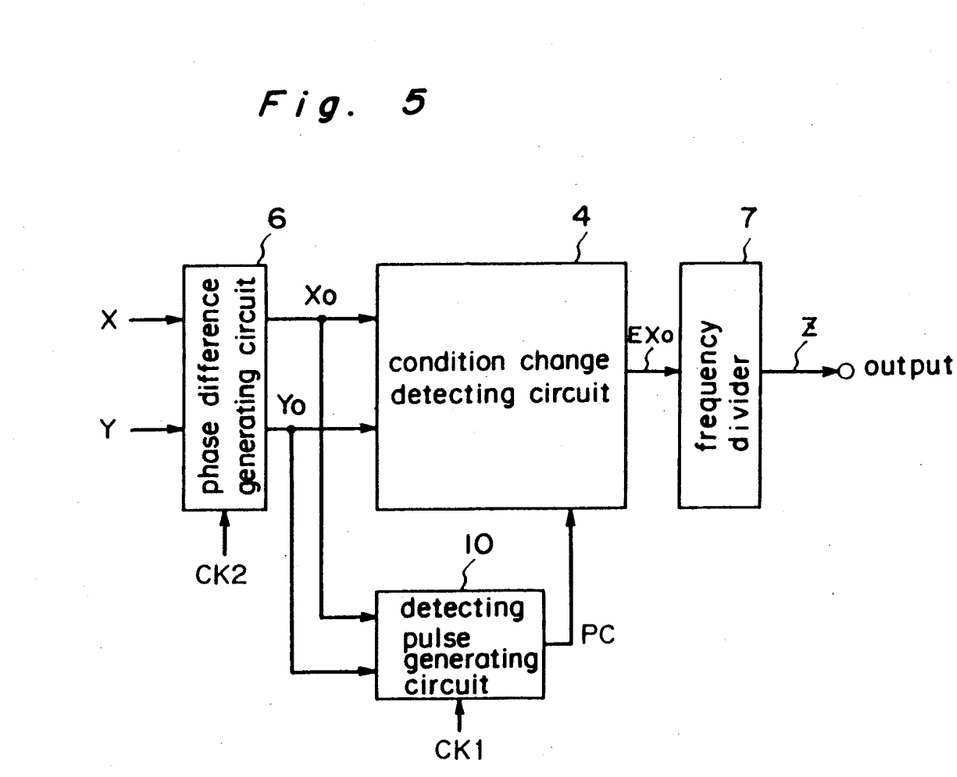
FIG. 5 is a block diagram showing another embodiment of a pulse detecting device according to the present invention.
Figure 6:
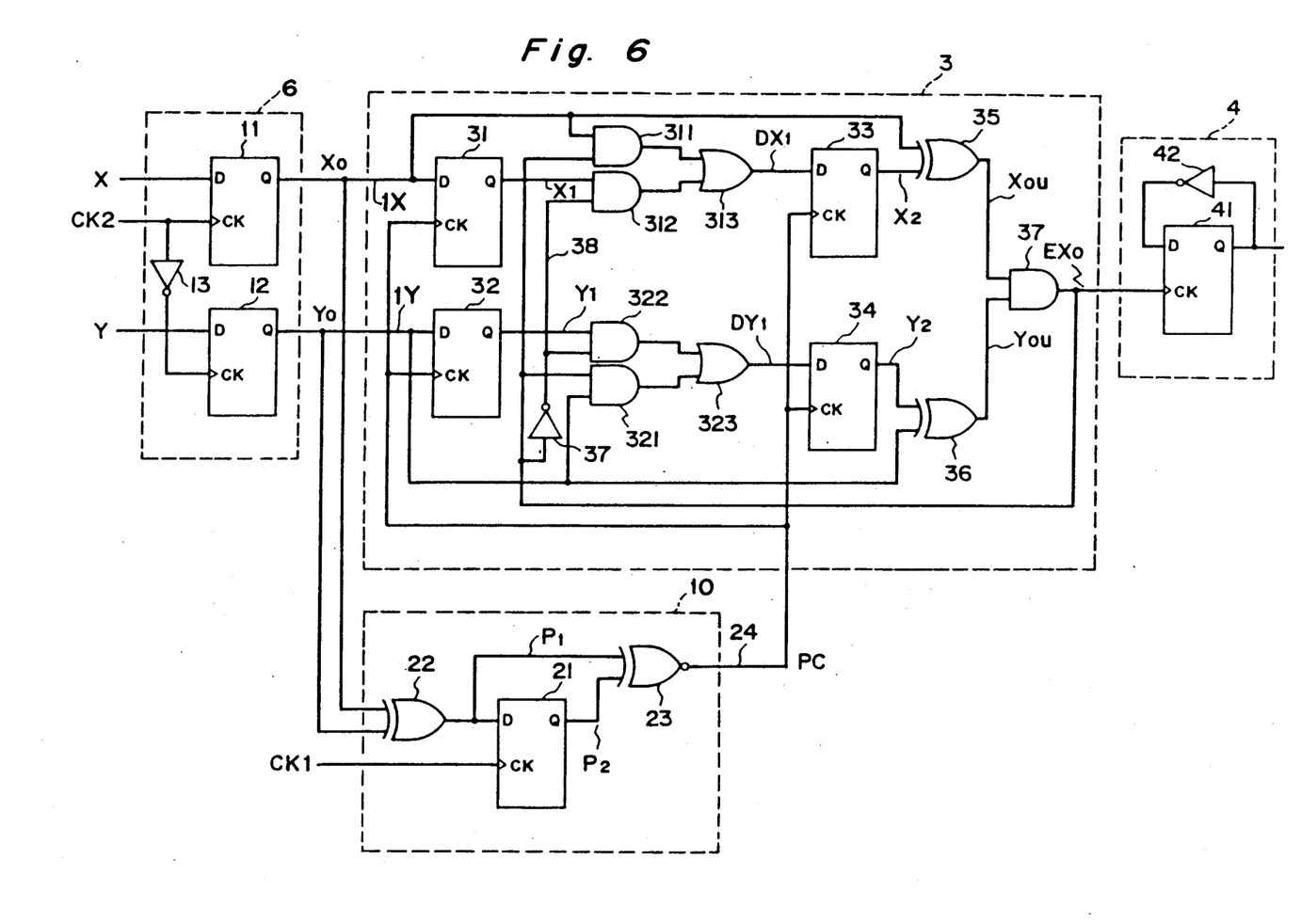
FIG. 6 is a detailed circuit diagram of the device shown in FIG. 5.
Figure 7:
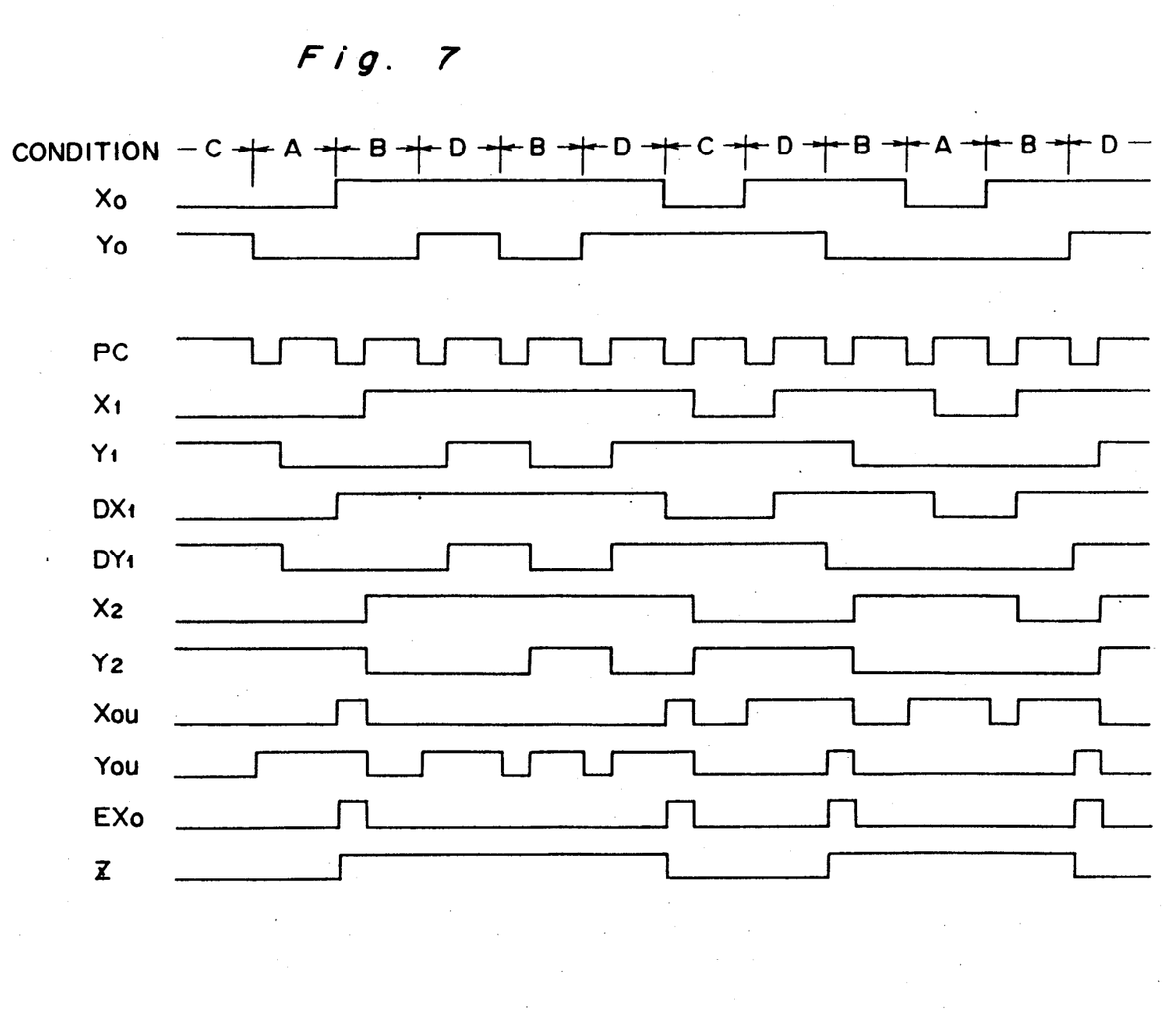
FIG. 7 is a timing diagram showing the operation of the device shown in FIG. 6.

The embodiment shown in FIG. 5 and FIG. 6 eliminates the problem mentioned above.

It is noted that like parts are designated by like reference numerals throughout the drawings and the detailed explanation of the like parts already explained in the foregoing is herein omitted.

There is provided a detecting pulse generating circuit 10 which generates a pulse when any one of the signals X0 and Y0 is changed. The output of the detecting pulse generating circuit 10 is coupled to the condition change detecting circuit 4 to provide an enabling pulse to the condition change detecting circuit 4.

The condition change detecting circuit 4, as shown in FIG. 6, comprises two stages of flip-flops 31 and 32, and 33 and 34 for the X input and the Y input, respectively, and detects change of both input pulse signals X0 and Y0, generating signal EXO. The frequency of the signal EXO is divided into ½ by the frequency divider 7 and the divided output signal Z is generated.

Referring further to FIG. 6 showing the detailed circuit of the second embodiment of the pulse detecting device the detecting pulse generating circuit 10 comprises an exclusive OR gate 22, an exclusive NOR gate 23 and a flip-flop circuit 21. The clock pulses CK1 for the flip-flop 21 has a pulse frequency of twice of the frequency the clock pulses CK2 applied to the phase difference generation circuit 6. Every time the condition of the signals on the input terminals X and Y change, the circuit 10 generates a pulse PC on the line 24 in synchronism with the clock pulse CK1 with a pulse length equal to the length of one cycle of the clock pulse CK1.

The condition change detecting circuit 4 comprises four flip-flops 31, 32, 33 and 34 each receiving the signals PC as the clock pulses, AND gates 311, 312, 321 and 322, OR gates 313 and 323, two exclusive OR gates 35 and 36 and an inverter 37.

In operation, when the flip-flops 11 and 12 maintain the outputs X0 and Y0 (this condition is referred to as the condition S3), in this case, the flip-flops 31 and 32 hold the outputs X1 and Y1 of the condition S2. The flip-flops 33 and 34, which receive the signals DX1 and DY1 prepared by switching any one of X1 or X0 and Y1 or Y0 by the signal EXO, hold signals X2 and Y2, that is the condition S1.

When the level of the signals X0 and X2 are different, the output Xou of the exclusive OR gate 35 is made "1". When the level of the signals Y0 and Y2 are different, the output You of the exclusive OR gate 36 is made "1". When both of the exclusive OR gates output logic "1", the signal DX1 is made X0 and DY1 is made Y0.

Figure 9:
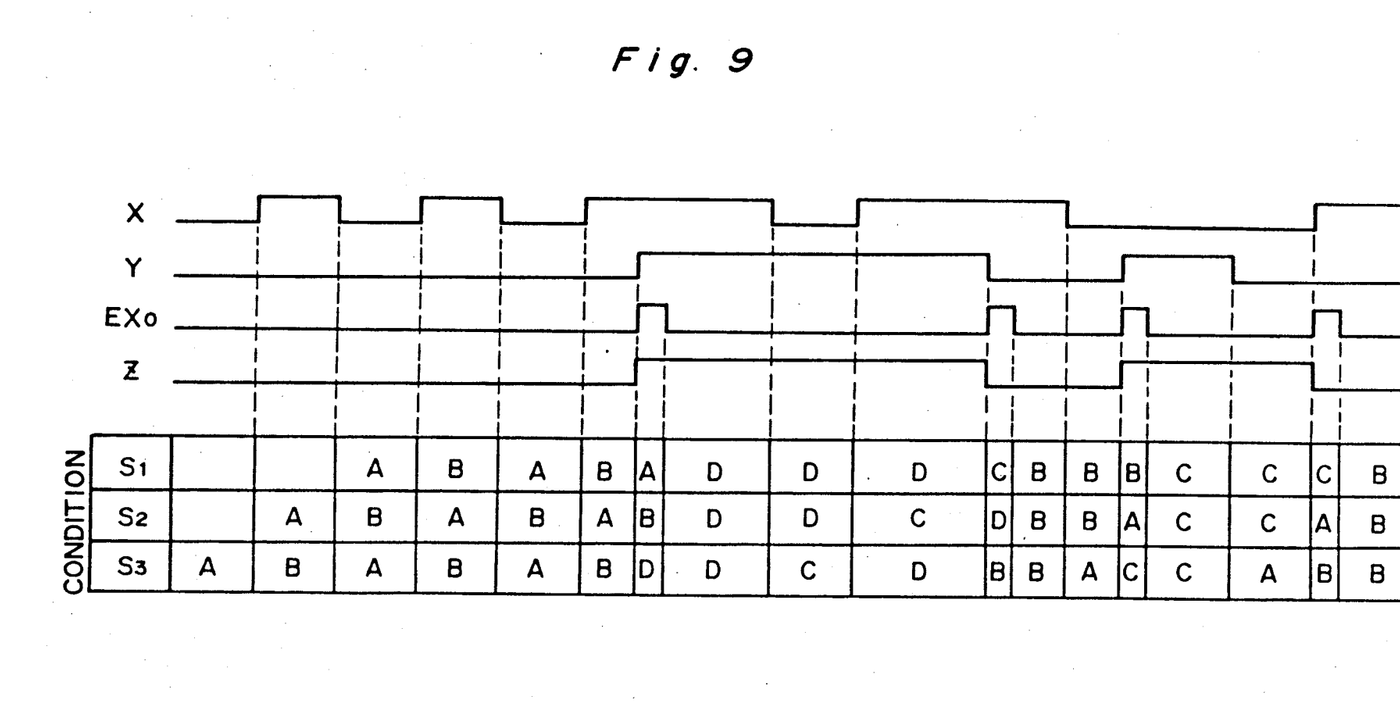

As a result, assuming that the conditions S1 and S3 correspond to A and B respectively or vice versa, and to B and C or vice versa, the signal EXO is generated, whereby the condition the same as S3 is set as the conditions S1 and S2. Namely, when the signal EXO is generated, all of the conditions before generation of the signal EXO are cleared off and a new operation can be started after the signal EXO is generated. In case the condition changes in the same manner as A - B - D - C - D - B as shown in FIG. 4, the EXO signal is generated by the change A - B - D, the conditions A and B are neglected. Therefore, the EXO signal is not generated at the condition C but is generated at the time of change of the conditions C - D - B as shown in FIG. 9. It can be understood from FIG. 9 that the wave form of the signal Z, which is ½ the frequency of divided EXO signal is equal to the signal Y.

Figure 8:
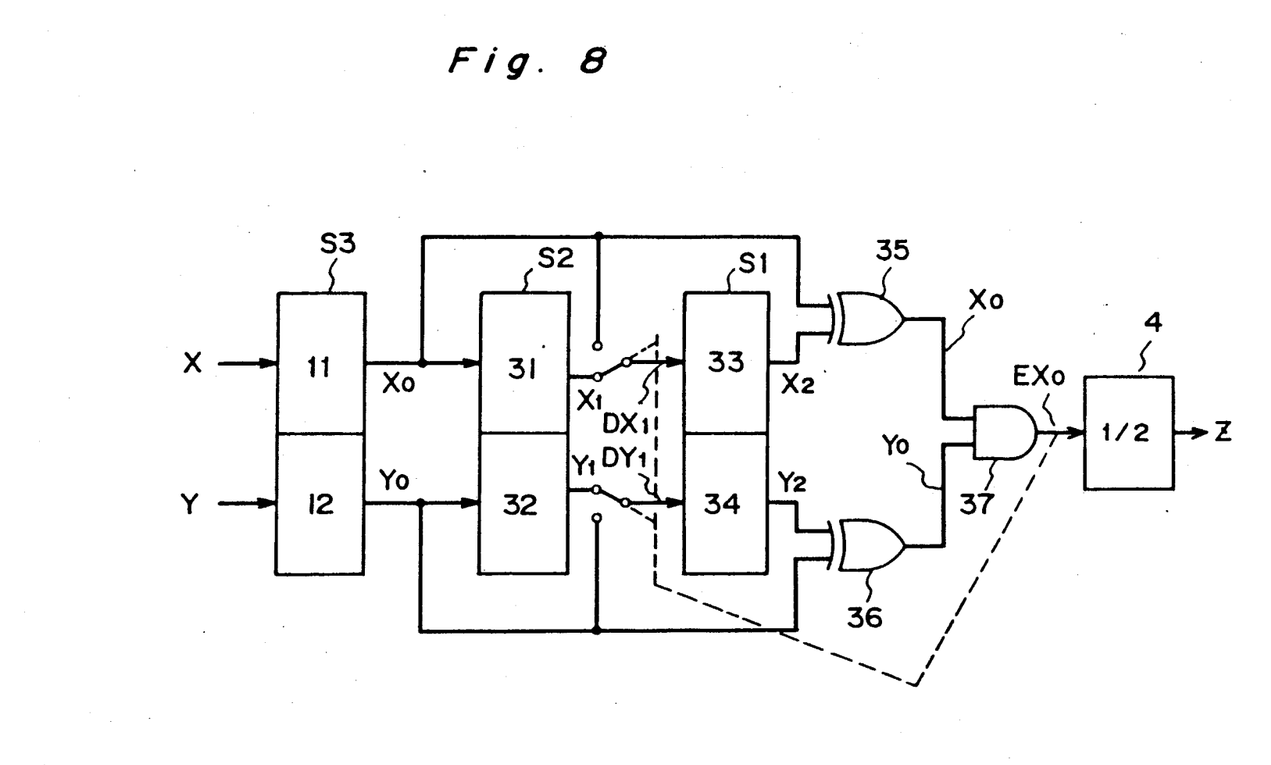
FIG. 8 is a circuit diagram showing operation of the device shown in FIG. 5, and, FIG. 9 is a timing diagram showing operation of the device shown in FIG. 5.

From FIGS. 8 and 9 showing the operation of the circuit arrangement of FIG. 6, it can be seen that the output signal Z is synchronized with the slower signal Y in the left half portion of the drawing of FIG. 9. In the right half portion, the signal Z synchronizes with the slower signal X.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A pulse detecting apparatus comprising:
pulse detecting means, receiving first and second input pulse signals, for detecting input conditions of said first and second input signals and providing detected pulse signals indicative thereof;
pulse change detecting means, coupled to said pulse detecting means, for detecting a change in said input conditions of said first and second input signals in accordance with said detected pulse signals and for providing pulse change signals indicative thereof; and
pulse synthesizing means, coupled to said pulse change detecting means, for synthesizing an output pulse of a frequency corresponding to a slower frequency of said first and second input pulse signals in accordance with said pulse change signals.

2. The pulse detecting apparatus of claim 1 further comprising:
phase difference generation means for generating from corresponding unmodified first and second input pulse signals said first and second input pulse signals of different phase even if said corresponding unmodified first and second input pulse signals change with identical phase.

3. The pulse detecting apparatus of claim 2, said phase difference generation means comprising:
first and second type-D flip-flops coupled respectively to and delaying said corresponding unmodified first and second input pulse signals; and
an inverter, coupled to a system clock, for inverting said system clock and providing said inverted system clock to said second type-D flip-flop, said first type-D flip-flop coupled directly to said system clock,
said first and second type-D flip-flops respectively outputting said first and second input pulse signals.

4. The pulse detecting apparatus of claim 1, said pulse detecting means outputting first through fourth said detected pulse signals and comprising:
a first NAND gate, coupled to said first and second input pulse signals, for outputting said first detected pulse signal;
a second NAND gate, coupled to an inverted said first input pulse signal and an inverted said second input pulse signal, for outputting said second detected pulse signal;
a third NAND gate, coupled to said inverted first input pulse signal and said second input pulse signal, for outputting said third detected pulse signal; and
a fourth NAND gate, coupled to said first input pulse signal and said inverted second input pulse signal, for outputting said fourth detected pulse signal.

5. The pulse detecting apparatus of claim 4, said pulse change detecting means outputting first and second said pulse change signals and comprising:
a first R-S flip-flop, coupled to said first and second detected pulse signals, for outputting said first pulse change signal; and
a second R-S flip-flop, coupled to said third and fourth detected pulse signals, for outputting said second pulse change signal.

6. The pulse detecting apparatus of claim 5, said pulse synthesizing means comprising:
an exclusive OR gate, coupled to said first and second pulse change signals, for outputting said output pulse.

7. The pulse detecting apparatus of claim 6 further comprising a type-D flip-flop for frequency dividing said output pulse.

8. A pulse detecting apparatus for generating an output pulse signal of a frequency corresponding to an input pulse signal of slower frequency comprising:
first means, coupled to first and second input pulse signals, for outputting corresponding first and second phase adjusted pulse signals of different phase even if said first and second pulse input signals are of similar phase;
second means, coupled to said first means, for generating a clock pulse signal in accordance with said first and second phase adjusted pulse signals;
third means, coupled to said first means and clocked by said clock pulse signal of said second means, for generating a pulse discriminating signal indicative of a timing of a slower frequency of said first and second input signals; and
fourth means, coupled to said third means, for frequency dividing said pulse discriminating signal to generate said output pulse signal.

9. The pulse detecting apparatus according to claim 8, said first means comprising:
first and second type-D flip-flops, coupled respectively to and delaying said first and second input pulse signals; and
an inverter, coupled to a system clock, for inverting said system clock and providing said inverted system clock to said second type-D flip-flop, said first type-D flip-flop coupled directly to said system clock,
said first and second type-D flip-flops respectively outputting said first and second phase adjusted pulse signals.

10. The pulse detecting apparatus according to claim 8, said second means comprising:
a first exclusive OR gate for receiving said first and second phase adjusted pulse signals and generating a first signal;
a first type-D flip-flop, settable by said first signal and clocked by a clock signal, for generating a first flip-flop signal; and
a second exclusive OR gate, coupled to said first signal and said first flip-flop signal, for generating said clock pulse signal.

11. The pulse detecting apparatus according to claim 8, said third means comprising:
a first pair of type-D flip-flops receiving said first and second phase adjusted pulse signals, respectively;
a first pair of AND gates receiving said first and second phase adjusted pulse signals, respectively;
a second pair of AND gates receiving outputs of said first pair of type-D flip-flops;
a second pair of type-D flip-flops receiving outputs of said first pair of AND gates and clocked by said clock pulse signal;
a first exclusive OR gate receiving said first phase adjusted pulse signal and an output of one of said second pair of type-D flip-flops; and
a second exclusive OR gate receiving said second phase adjusted pulse signal and an output of another of said second type-D flip-flops.

12. The pulse detecting apparatus according to claim 11, said third means further comprising an AND gate coupled to said first and second exclusive OR gates for outputting said pulse discriminating signal.

13. The pulse detecting apparatus according to claim 8, said fourth means comprising a type-D flip-flop.